US007163405B2

(12) United States Patent
Geil et al.

(10) Patent No.: US 7,163,405 B2
(45) Date of Patent: Jan. 16, 2007

(54) CONNECTOR ASSEMBLY APPARATUS FOR ELECTRONIC EQUIPMENT AND METHOD FOR USING SAME

(75) Inventors: Jacob Geil, Irvine, CA (US); William Keung, Brea, CA (US); Dan Ciocan, Fullerton, CA (US)

(73) Assignee: RGB Systems, Inc., Anaheim, CA (US)

( * ) Notice: Subject to any disclaimer, the term of this patent is extended or adjusted under 35 U.S.C. 154(b) by 0 days.

(21) Appl. No.: 10/846,442

(22) Filed: May 14, 2004

(65) Prior Publication Data

US 2005/0255720 A1 Nov. 17, 2005

(51) Int. Cl.
*H01R 12/00* (2006.01)
*H05K 1/00* (2006.01)

(52) U.S. Cl. ........................................................ 439/63

(58) Field of Classification Search .................. 439/63, 439/581, 532, 579
See application file for complete search history.

(56) References Cited

U.S. PATENT DOCUMENTS 4,645,288 A * 2/1987 Stursa ........................ 439/581
6,386,913 B1 * 5/2002 Mohammad et al. ....... 439/579

* cited by examiner

*Primary Examiner*—Javaid H. Nasri
(74) *Attorney, Agent, or Firm*—The Hecker Law Group, PLC

(57) ABSTRACT

A connector assembly and a method of utilizing a connector assembly to enhance performance, improve reliability and provide ease of assembly of electronic equipment are presented. The connector assembly comprises a rigid bracket capable of holding multiple connectors. The bracket acts as a common ground for all of the connectors. The connector assembly has multiple legs and connector conductors that insert into corresponding apertures on a PCB. The legs of the connector assembly are configured to permit the placement of circuit traces on the PCB in the spaces between the legs. After placement of the connector assembly onto the PCB, soldering or other techniques may be used to secure the connector assembly to the board and to connect the proper circuits to the connectors. Because the connectors are installed on the rigid bracket, repeated physical stresses induced on the ports or jacks do not affect the integrity of the PCB.

37 Claims, 7 Drawing Sheets

CONNECTOR ASSEMBLY APPARATUS FOR ELECTRONIC EQUIPMENT AND METHOD FOR USING SAME

BACKGROUND OF THE INVENTION

1. Field of the Invention

The present invention relates to electronic communication equipment, and more particularly to a connector assembly for electronic hardware.

2. Background Art

There are a wide variety of instances in which it is desirable to mount connectors, such as input/output ports (or jacks) on a printed circuit board, for transmission of signals between different internal elements of an electronic device or for transmission of signals between one or more elements of the device and electronic equipment external to the device. For example, audio/video devices such as switchers may include a number of ports protruding through an outer frame for connecting with a number of external electronic devices. Each port is typically connected, within the switcher or other type of device, to one or more unshielded wires leading to one or more locations on an internal printed circuit board (PCB or PC board) that deliver an output signal(s) and/or receive an input signal(s).

If the port is an output port, a mating plug or connector when connected thereto will receive an output signal from the PC board. If the port is an input port, a mating plug or connector when connected thereto can deliver an input signal to the PC board. In this manner, audio, video, communication and/or control signals may be transmitted in and out of the electronic device via those port connections.

Many types of ports are commonly used by those in the art. One example of a widely used port is the BNC connector (variously known as a "bayonet nut connector" or "Bayonet Neill Concelman" connector). When multiple BNC connectors are installed on a printed circuit board, the integrity of the PCB board may be compromised each time a cable plug is attached to or removed from one of the connectors. The printed circuit board is flexible whereas the connectors are generally inflexible, resulting in the creation of stress points where the connectors meet the PC board. The frequent attachment and removal of cable plugs from the assembly may result in wearing of the PC board material and/or cracking of traces or solder on the printed circuit board, particularly in the vicinity of the connectors. Thus, after repeated use, these electronic devices may fail.

Another issue with placing multiple connectors on a PC board is that each connector must be individually placed and soldered. This added complexity adds to assembly time, as well as wear on the assembler. Further, the opportunities for alignment errors and solder failures increase with each connector. Obtaining uniform performance across multiple copies of the same PC board is made more difficult.

A further issue with connectors of the sort described above is that they have a detrimental effect on the transmission of high frequency signals. For example, the unshielded lengths of wire used to couple connectors to the PC board are subject to undesired effects such as crosstalk, and the added impedance of the unshielded wire and its contacts with the connector and the PC board results in degradation of the system frequency response, attenuating and distorting signals at higher frequencies.

There is a need for an improved connector assembly that provides more ease and reliability in manufacturing, structural strength to the printed circuit board assembly, and improved frequency response characteristics.

SUMMARY OF THE INVENTION

A connector assembly for one or more electronics connectors, such as input/output jacks or ports, and a method of utilizing a connector assembly are described. Embodiments of the connector assembly may be used to strengthen a printed circuit board assembly, provide improved reliability and ease of assembly for electronic devices, and improve signal transmission performance.

In one embodiment, the connector assembly comprises a rigid metal bracket upon which multiple connectors may be mounted. The metal bracket may provide a common ground to the connectors mounted thereon, and may act as a strength-enhancing rigid support for a printed circuit board to which it may be attached. The metal bracket may be configured for easy installation of connectors for electronic equipment, such as BNC connectors. The metal bracket may be further configured with legs that may seat in apertures on a printed circuit board.

During assembly of an electronic device, the connector assembly may be seated in a printed circuit board by sliding the legs of the metal bracket into pre-made apertures on the printed circuit board. After seating the connector assembly in the apertures of the printed circuit board, soldering or other adhesive techniques may be used to secure the connector assembly to the board and to electrically connect the proper circuits to the connectors. Signal pins of the connectors may protrude through the metal bracket for insertion directly through further apertures in the PC board for subsequent soldering, without the addition of intervening unshielded wires as may be required in circuits of the prior art. Precision placement of ground and signal contacts on the PC board may thus be achieved, with much improved quality control. Further, the proximity of the connector to the PC board minimizes any associated impedance effects and signal crosstalk. Higher frequency signals can therefore be supported with less signal degradation than in prior art systems.

In one embodiment, the connector assembly may be configured to accept multiple connectors. Because the connectors are installed as a group on the rigid metal bracket, frequent attachment and removal of external electronic equipment to and from the ports or jacks (i.e., connectors) place much less stress on the attached PC board. The soldering integrity is maintained and the printed circuit board is stiffened and supported by the rigid connector assembly.

In one or more embodiments, the connector assembly may be configured to accept connectors in an inline fashion or any other arrangement. For instance, the connector assembly may be configured such that apertures for installation of connectors are arranged in a line along the top plate from one end to the other end. The line could be straight or assume any other shape. The connector assembly could also be configured to accept connectors in a two-dimensional grouping, such as a two-by-two bank of connectors, or a two-by-four bank of connectors, etc. The particular configuration may be selected based on other considerations, such as the form factor of the device in which the connector assembly is to be mounted, or the traditional configuration of individually placed connectors of the prior art for the given type of device. Thus, the arrangement of the connectors on the connector assembly may vary among different embodiments.

DETAILED DESCRIPTION OF THE INVENTION

A connector assembly for one or more electronics connectors and a method of utilizing the connector assembly are described. In the following description, numerous specific details are set forth in order to provide a more thorough description of the present invention. It will be apparent, however, to one skilled in the art, that the present invention may be practiced without these specific details. In other instances, well-known features have not been described in detail so as not to obscure the invention.

In general, one or more embodiments of the invention may include an assembly for a plurality of connectors (e.g., audio/video) to be mounted, as a group, on a printed circuit board (PCB or PC board). The connector assembly of the present invention may be configured for a plurality of input/output connectors. For instance, an embodiment of the present invention may include a plurality of BNC connectors for audio/video equipment.

In one embodiment, the connector assembly includes a metal structure that incorporates multiple connectors. The metal structure acts as a common ground plane and provides a rigid support for the input/output connectors. Though referred to as a metal structure, reflecting the preferred embodiment, the structure may be formed from any material or combination of materials that provide the characteristics of rigidity and conductivity, including, for example, metal-plated materials.

The connector assembly, comprising the metal structure and the connectors, is configured to mount onto a printed circuit board as a single unit, simplifying the manufacturing process for electronic equipment requiring connectors attached to a PCB. In addition, in one or more embodiments, the metal structure provides structural strength to the assembly and PC board when mounted on the PC board.

Figure 3A:
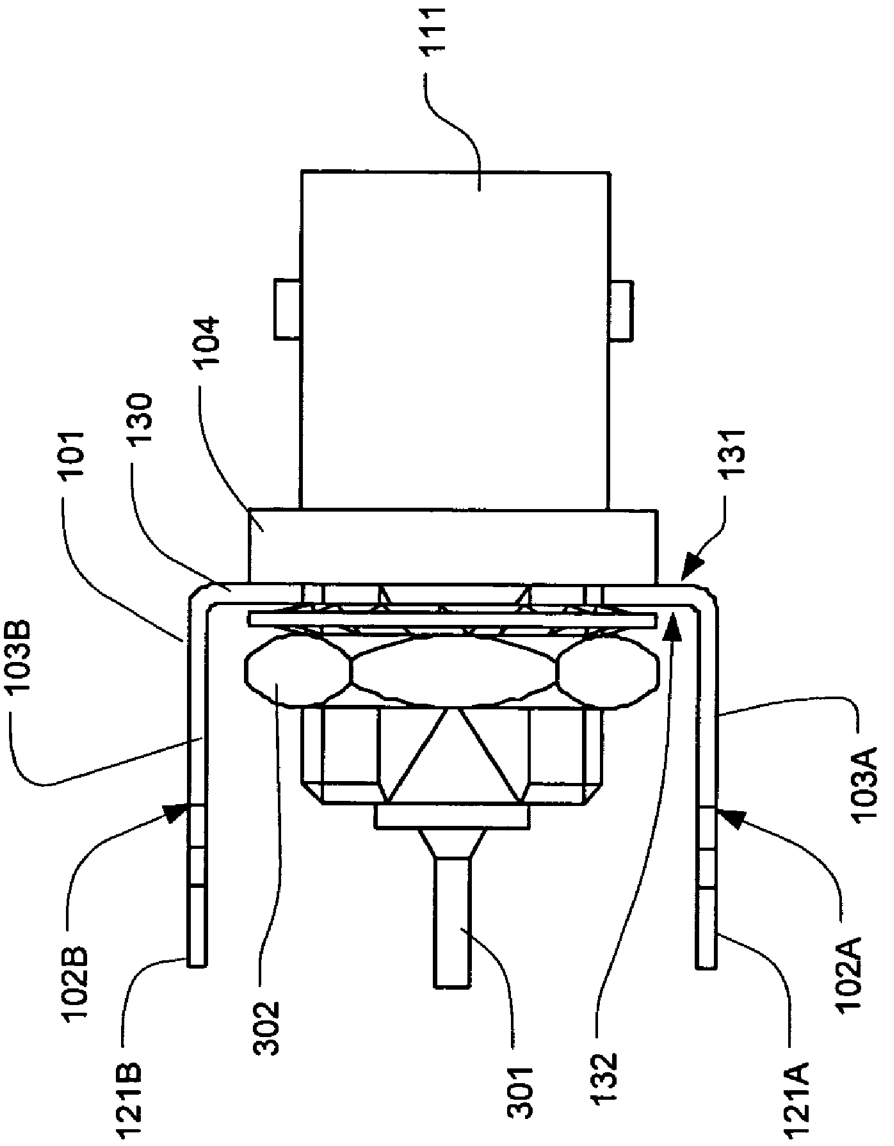
FIG. 3A is a first side view of the connector assembly illustrated in FIG. 1, illustrating the coupling of an input/output connector, in accordance with an embodiment of the present invention.
Figure 3B:
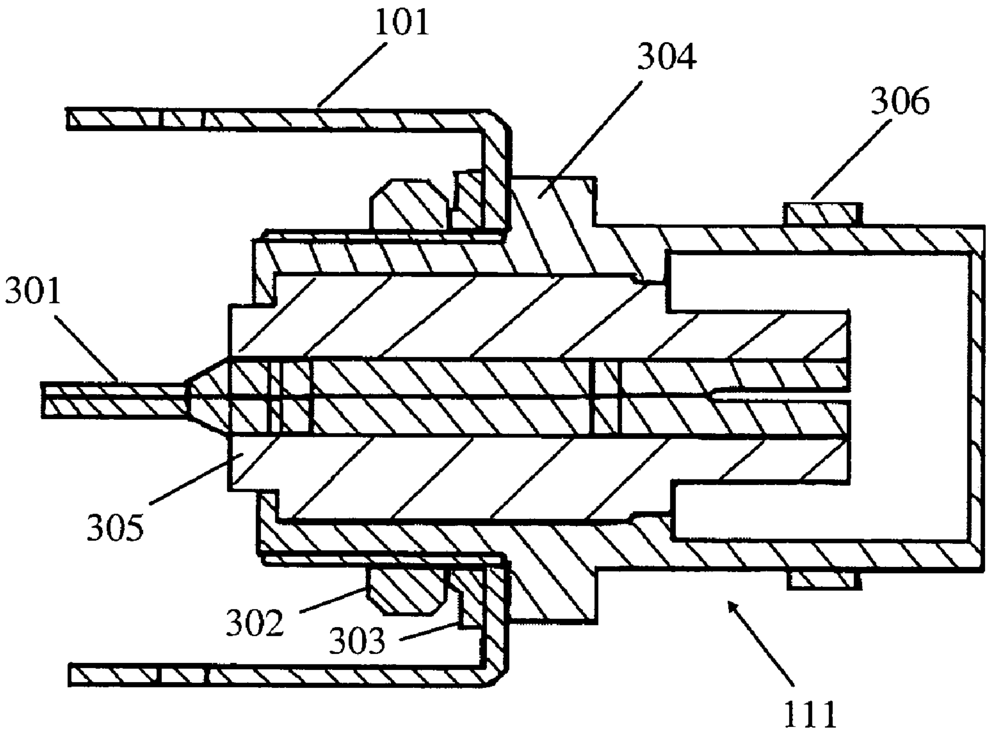
FIG. 3B is a cross-sectional side view of the connector assembly illustrated in FIG. 1, in accordance with one or more embodiments of the present invention.

One embodiment of a connector assembly of the invention will now be described in more detail. Referring to FIGS. 1, 2, 3A and 3B, connector assembly 100 includes a metal bracket 101. As illustrated in FIGS. 3A and 3B, metal bracket 101 may be, but is not limited to, a U-shaped structure. In one embodiment, metal bracket 101 may be composed of a nickel-plated SPCC steel or other metallic material. The shape and type of material for metal bracket 101 may vary and may depend on a variety of factors including: providing adequate strength to the assembly and providing electrical conduction to act as a common ground plane for multiple input/output connectors (e.g., 111–115) mounted thereon. The number and type of connectors depend on the application and is not limited to those illustrated herein.

Metal bracket 101 may have a variety of configurations. In the configuration of the current illustration, the U-shaped metal bracket 101 has a top section 130, a front side flange 103A and an opposing rear side flange 103B. The top section 130 of metal bracket 101 is of generally uniform thickness, with a top face 131 and a bottom face 132. The front side flange 103A and rear side flange 103B (see FIG. 3A) are located along opposing sides of top section 130, and extend generally parallel to one another, and generally perpendicular to the top section 130. The thickness of flanges 103A and 103B are shown as being generally the same as the thickness of section 130, though this need not be the case for all embodiments. In one embodiment, flanges 103A and 103B and section 130 may each be approximately 0.024 inches thick, for example.

Along the bottom edge 102A of front side flange 103A are multiple legs 121A, 122A, 123A, 124A, 125A, etc. Similarly, along the bottom edge 102B of rear side flange 103B are multiple legs 121B, 122B, 123B, 124B, 125B, etc. The number of legs in each flange may vary and generally depend on support strength requirements for the connector assembly. For stability reasons, it is preferred, though not required, that one flange comprise at least one leg, and the opposing flange comprise two or more legs. Two-dimensional stability is improved by having at least three support points (legs), where one point does not fall on the axis defined by the other two points. In embodiments comprising more than two flanges, it is possible to have zero legs on one or more flanges and/or one or more legs on two or more flanges. It is also preferred, though not required, that the legs be generally evenly distributed with respect to the connectors to obtain uniform conductivity over the common ground plane.

Figure 4:
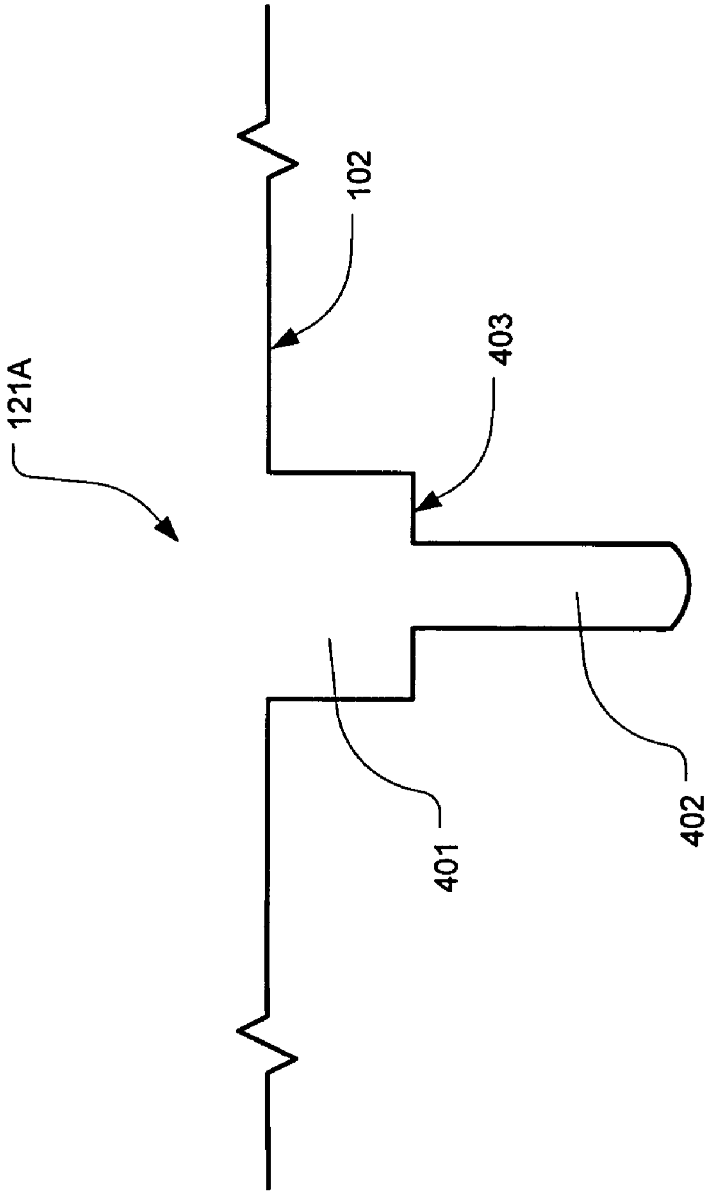
FIG. 4 is an expanded view of a leg of the connector assembly illustrated in FIG. 1, in accordance with an embodiment of the present invention.

One leg configuration in accordance with an embodiment of the invention is illustrated in FIG. 4. As illustrated, FIG. 4 is a cut-out section of one of the legs, for example, leg 121A, illustrated in FIG. 1. In this embodiment, the leg is configured to have one or more steps, for example, a two-stepped shape having a wider section 401 and a narrower section 402 (the tip of the leg). The edge or surface 403 between sections 401 and 402 provides support (i.e., a seat) for metal bracket 101 when metal bracket 101, and hence leg 121A, is seated on a printed circuit board. For instance, when metal bracket 101 is installed on the board during assembly, section 402 is inserted into, and possibly through, an aperture (e.g., a drilled or otherwise pre-made hole) on the printed circuit board, until edge 403 abuts the top surface of the printed circuit board (i.e., the hole is typically of smaller diameter than the width of section 401).

A stepped leg configuration makes soldering easier by preventing deeper penetration of the leg than desired. Of course, other configurations of leg 121A may be used that will provide the desired support and manufacturing convenience. For example, surface 403 may exist on only one side of leg 121A, rather than both sides as shown. Further, section 401 may be omitted entirely if the design permits the metal bracket to abut the printed circuit board along surface 102 between respective legs.

An advantage to using the stepped approach in the leg design is that by maintaining some distance between the metal bracket and the printed circuit board, the designer is able to place conductive traces on the board surface between the legs of the connector assembly. This provides the designer with more flexibility in board design, particularly with respect to setting traces for the connectors themselves.

In other embodiments, the surface 102 may be coated with an insulating material where the metal bracket would abut the printed circuit board. This would permit traces to be set under surface 102. However, the stepped design is preferred because an abutting metal bracket, even if coated with an insulator, may damage any underlying traces, resulting in possible circuit failure; or the insulator may be worn away, allowing a short to the common ground provided by the metal bracket.

Returning back to FIGS. 1–3B, there may be multiple apertures 140 (not shown exclusively) on metal bracket 101 wherein multiple input/output connectors may be mounted. For instance, input/output connectors 111, 112, 113, 114, and 115 may be mounted on top plate 130 of metal bracket 101, through apertures 140A, 140B, 140C, 140D, and 140E, respectively. Input/output connectors 111 through 115 may be BNC connectors, for example.

Figure 1:
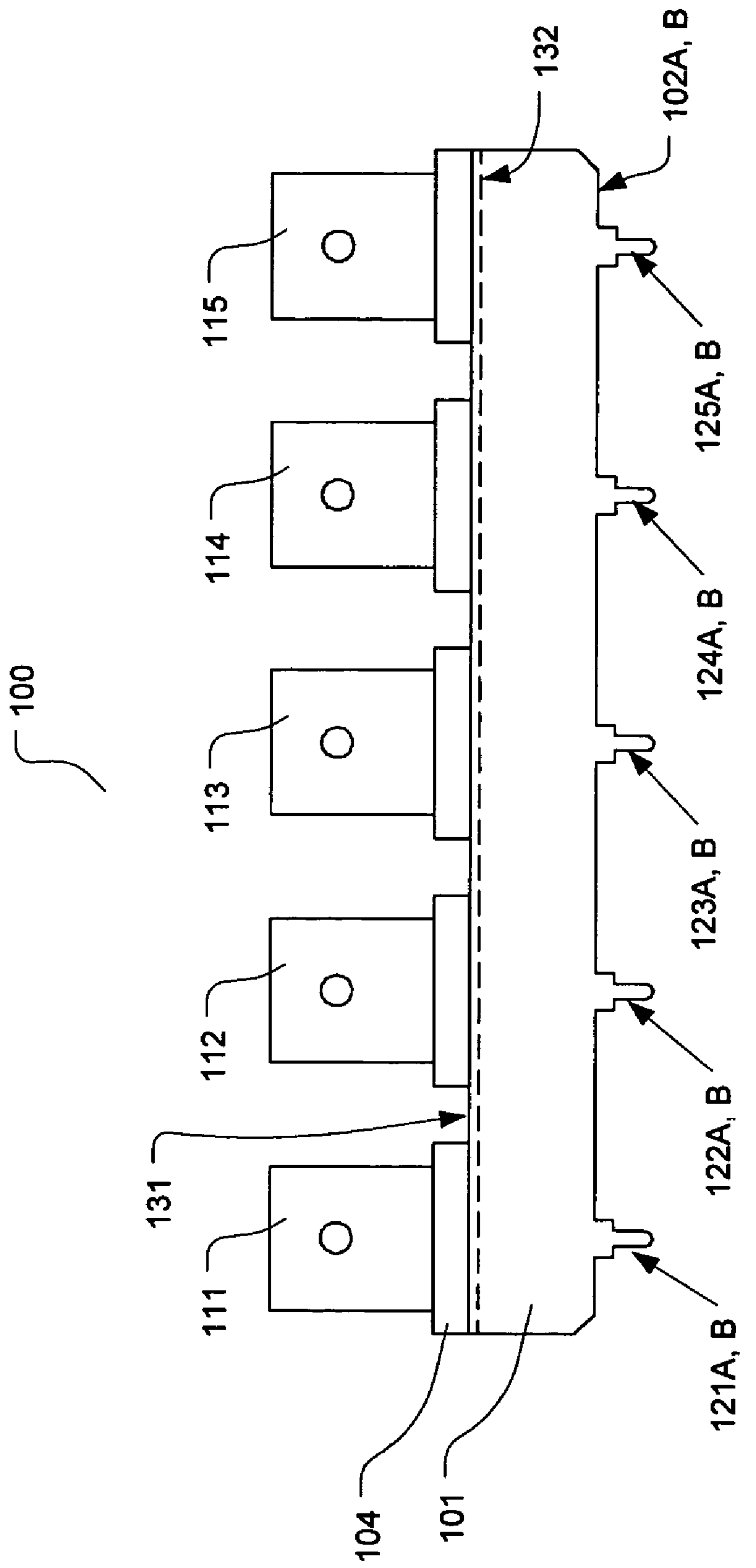
FIG. 1 is a front view of a connector assembly in accordance with an embodiment of the present invention.
Figure 2:
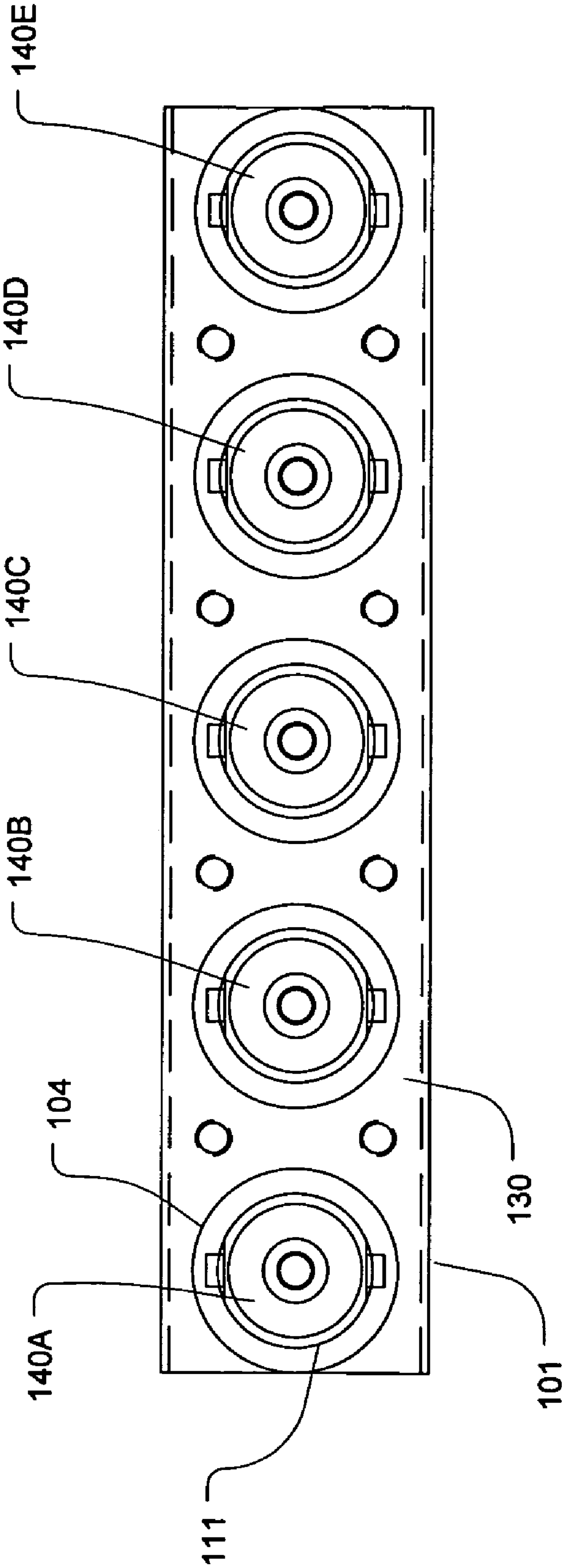
FIG. 2 is a top view of the connector assembly that is illustrated in FIG. 1, in accordance with an embodiment of the present invention.

As illustrated in FIG. 1, these connectors may comprise input and output jacks 111–115, such as for audio and video signals. The particular types of jacks, ports or connectors that are mounted may vary. For example, the connectors or jacks may be for S-video, coaxial audio or video, component video, composite video, digital optical or coaxial, RS-232, USB (Universal Serial Bus), power, or a wide variety of other types of connectors now known or later developed. As indicated, the metal bracket 101 may be configured to accept more than one connector.

Each connector may be mounted as illustrated in FIGS. 3A and 3B, for example. In one embodiment where the connector is a BNC connector, the connector 111 may be mounted on the top plate 130 such that the external connector end is situated on the top surface side 131.

Means may be provided for mounting the connectors on metal bracket 101, which acts as a support structure for the connectors. In one embodiment, those mounting means may comprise one or more fasteners, such as threaded fasteners or bolts. In addition, adhesive or other means may be utilized. In an alternative embodiment, the inner surfaces of the apertures in top plate 130 may be threaded to permit a threaded connector to be screwed into the aperture. In such an embodiment, top plate 130 may have an increased thickness to accommodate threading. A combination of mounting means may also be used.

Multiple apertures 140A–E (not visible) may be provided in the top plate 130 of metal bracket 101. As illustrated, these apertures 140A–E comprise holes or openings through the top plate 130 from the top surface 131 to the bottom surface 132. In the embodiment illustrated, five apertures 140A through 140E are provided, arranged in an inline pattern on the centerline of top plate 130. Other numbers and arrangements of apertures may be provided and they may be located in a variety of positions. For better grounding performance, it is preferred, though not required, that the connectors be generally evenly distributed.

The opening of each aperture 140 may be defined by the type of connector. For instance, in one embodiment, the aperture is generally a circular opening that may be centrally located in the top plate 130 between flanges 103A and 103B.

The base 104 of the connector 111 provides support for each connector on the top surface 131 of top plate 130. On bottom surface 132 of top plate 130, a hex nut 302 or equivalent device provides support for securing the input/output connector 111 on top plate 130. Base 104 and hex nut 302 may be a metallic type of material in order to provide structural support for the connector 111. Also, the type of material used in base 104 and/or nut 302 may be such that it provides electrical conduction from the ground of the connector to the metal bracket 101, which may act as common ground to one or more of the connectors 111–115.

Secure mounting of connectors 111–115 on metal bracket 101 allows for using a thinner center conductor or signal pin (on or about 0.039 inches in diameter in one embodiment, for example) for each connector than in the prior art. For instance, center conductor 301 may be thinner than those in the prior art, because metal bracket 101 provides solid structural support for the entire connector assembly, minimizing any lateral movement of the PC board or the connectors with respect to each other.

Further, in one or more embodiments, the center conductor 301 may remain within the shielded environment of the coaxial cable structure through the length of the connector to a point that is near the surface of the PC board. For example, in FIG. 3B, center conductor 301 may extend beyond the shielded environment of the connector on or about the depth of edges 102A and 102B, and couple to the PC board at the depth of surface 403 (see also, FIG. 4). The length of section 401 of each leg may be used to insure that the connector body itself (e.g., either insulating layer 305 or outer conductor 304) does not make contact with the PC board.

The small, unshielded span of center conductor 301 may be much shorter than the length of unshielded wire that typically couples the center conductor of connectors to PC boards in circuits of the prior art. This reduction in the unshielded length of the center conductor provides greater protection from crosstalk between the center conductor and other signal sources (e.g., other center conductors, signal traces on the underlying PC board, etc.). Also, the impedance at the transition between the connector and the PC board is reduced, improving high frequency performance.

FIG. 3B is a cross-sectional view of a connector assembly having a BNC connector, in accordance with an embodiment of the invention. As shown, the connector 111 is seated within a connector aperture of metal bracket 101. Connector 111 is held in place by base 104 butting against the top surface (131) of bracket 101, and the nut (302) and washer (303) combination butting against the underside (132) of bracket 101. In one embodiment, base 104 is an annular protuberance formed around the outer surface of connector 111, though in other embodiments base 104 may be formed as a separate element (e.g., as a second nut threaded onto the outer surface of connector 111).

In an embodiment, outer conductor 304 is configured with a hollow bore within which lies the center conductor 301, separated from the outer conductor by a surrounding insulating layer 305. At the external end of connector 111, the inner bore of the outer conductor is widened and the outer diameter of the insulating layer 305 is narrowed to form a cylindrical gap. An end of center conductor 301 is exposed within the cylindrical gap, to be mated with the center pin of a coaxial cable. The outer surface of the outer conductor is configured with two opposing stubs 306, which facilitate the connection of the outer conductor of a coaxial cable to connector 111 in a known manner.

At the internal end of connector 111 (i.e., the end protruding within the space bounded by the side flanges and top of metal bracket 101), in one or more embodiments, outer conductor 304 may extend through the connector aperture on or about 0.27 inches, and insulating layer 305 may extend slightly beyond the outer conductor. For example, insulating layer may extend through the connector aperture on or about 0.30 inches. Center conductor 301 may narrow from 0.083 inches in diameter to 0.039 inches in diameter as it extends past the end of the insulating layer. Center conductor 301 may extend, for example, to a distance on or about 0.50 inches from the connector aperture.

In this same embodiment, the lower edge 102 of the flanges may reside on or about 0.325 inches below the connector aperture, and the step surface 403 (i.e., where the PC board will abut) may reside on or about 0.375 inches below the connector aperture. Given these exemplary values, outer connector 304 and insulating layer 305 do not protrude beyond lower edge 102 of the flanges. The unshielded distance between where center conductor 301 extends beyond outer conductor 304 and makes contact with the PC board is on or about 0.105 inches.

The actual distance values may vary from those above in other embodiments. However, as previously discussed, an advantage of having the center conductor 301 extend straight into the PC board, with a minimal unshielded distance between the connector body and the PC board, is that the circuit can transmit and receive higher frequency signals with less attenuation and distortion. The impedance associated with the connectors is reduced and crosstalk between the connectors is minimized.

In one embodiment, the material for bracket 101 may comprise SPCC steel, the material for outer conductor 304 and nut 302 may comprise brass, and the material for lock washer 303 and center conductor 301 may comprise phosphor bronze, for example. In addition, bracket 101, outer conductor 304, lock washer 303 and nut 302 may be nickel-plated. Center conductor 301 may be gold-plated.

The materials and measurements listed above are provided as examples of one operational design. Other materials may be used in other embodiments without departing from the scope of the invention.

In one embodiment, a center conductor 301 may be aligned, from the frontal view of FIG. 1, in a straight line between legs 121A and 121B. Subsequent center conductors may also be arranged between legs on opposite flanges. For instance, a center conductor of connector 112 may be aligned between legs 122A and 122B; a center conductor of connector 113 may be aligned between legs 123A and 123B; a center conductor of connector 114 may be aligned between legs 124A and 124B; and a center conductor of connector 115 may be aligned between legs 125A and 125B. Other positions of center conductors are also possible, while still obtaining the benefit of rigid support from metal bracket 101.

Figure 5:
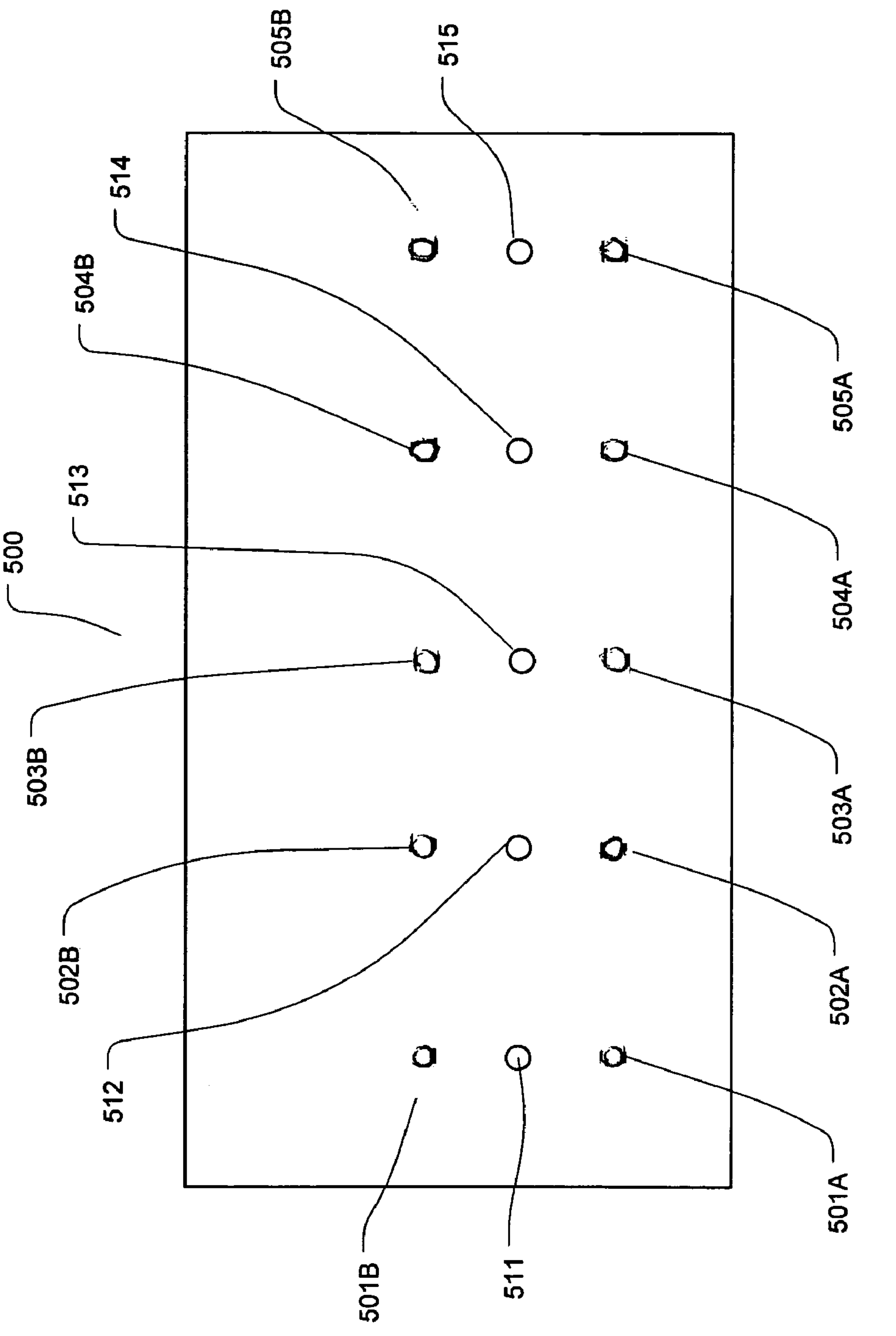
FIG. 5 is a partial top view of a printed circuit board configured to accept the connector assembly illustrated in FIG. 1, in accordance with an embodiment of the present invention.

Connector assembly 100 provides an easy mount for input/output connectors on printed circuit boards. FIG. 5 is an illustration of an aperture pattern on a printed circuit board that is configured to accept a connector assembly 100 having a connector arrangement as shown in FIGS. 1–3B. Note that PCB 500 may be configured to accept as many connector assemblies as needed.

As illustrated, printed circuit board 500 comprises leg apertures 501A–B, 502A–B, 503A–B, 504A–B, and 505A–B for mounting connector assembly 100. In addition, PCB 500 further comprises center conductor apertures 511, 512, 513, 514, and 515. PCB 500 may be configured to include the circuits for a particular application. For instance, PCB 500 may be configured to include the circuits and conductive traces for a particular application. For instance, PCB 500 may include traces to provide electrical continuity between terminals on the connector assembly, e.g., center conductors and ground connections (e.g., legs), and other circuit elements mounted on PCB 500

As illustrated, leg apertures 501A–B, 502A–B, 503A–B, 504A–B, and 505A–B comprise holes or openings through PCB 500, from the top surface to the bottom surface. Electrical connections may be provided, as necessary, between one or more leg apertures and the system ground. In the illustrated embodiment, a leg aperture is provided for each leg of connector assembly 100. However, it is not necessary to provide traces between each leg aperture and the system ground since the common connector assembly 100 provides the common ground plane for all of the connectors mounted on the connector assembly.

Each leg aperture provides a slot for insertion of a corresponding leg on the connector assembly. For instance, leg aperture 501A may be provided to accommodate leg 121A; leg aperture 501B may be provided to accommodate leg 121B; leg aperture 502A may be provided to accommodate leg 122A; leg aperture 502B may be provided to accommodate leg 122B; leg aperture 503A may be provided to accommodate leg 123A; leg aperture 503B may be provided to accommodate leg 123B; leg aperture 504A may be provided to accommodate leg 124A; leg aperture 504B may be provided to accommodate leg 124B; leg aperture 505A may be provided to accommodate leg 125A; and leg aperture 505B may be provided to accommodate leg 125B.

Other numbers of leg apertures may be provided and they may be located in a variety of positions on the PCB 500. In one embodiment, there may be a minimum of one leg aperture for each leg of connector assembly 100, and the leg apertures may be aligned to accept connector assembly 100 via its multiple legs. Each leg aperture may comprise a conductive material, preferably metallic, that also provides sufficient strength for coupling connector assembly 100. In one embodiment, the coupling between each leg aperture and each connector assembly leg may be accomplished by soldering.

Insertion of the legs into the apertures on PCB 500 inhibits lateral movement of the connector assembly with respect to PCB 500. The soldering of one or more legs to PCB 500 inhibits separation of the connector assembly from PCB 500, preventing any of the legs from slipping out of their respective apertures. The number of legs that are soldered to PCB 500 (from the total number of available legs) may vary according to the application and the environment in which the electronic equipment will be used. Better electrical ground stability is provided by an even distribution of soldered leg contacts and larger number of such contacts. Also, the structural stability of the equipment improves with the number of legs that are soldered (or otherwise coupled) to PCB 500.

The opening of each center conductor aperture may be defined by the type of connector. In one embodiment, the center conductor aperture is generally a circular opening that is centrally located between opposite leg apertures. For instance, center conductor aperture 511 may be located between opposite leg apertures 501A and 501B; center conductor aperture 512 may be located between opposite leg apertures 502A and 502B; center conductor aperture 513 may be located between opposite leg apertures 503A and 503B; center conductor aperture 514 may be located between opposite leg apertures 504A and 504B; and center conductor aperture 515 may be located between opposite leg apertures 505A and 505B.

In general, the arrangement of center conductor apertures is arranged to match the configuration of connectors on the connector assembly (or vice versa), such that when the legs of the connector assembly are inserted into respective leg apertures on PCB 500, the center conductors of the connectors will also be inserted into corresponding center conductor apertures. In embodiments where a connector has multiple signal conductors, additional conductor apertures may be drilled to accommodate the additional conductors in a similar fashion.

Each center conductor aperture (511–515) may comprise a conductive material, preferably metallic, that electrically couples each connector's center conductor to the circuit on PCB 500. In one embodiment, coupling between each center conductor aperture and each connector center conductor may be accomplished by soldering. If one connector is not needed in the circuit, the associated center conductor may be omitted from any soldering process. Also, the unneeded connector may be omitted from the connector assembly. The open connector aperture in metal bracket 101 may be left open or it may be covered with an aperture plug.

Figure 6:
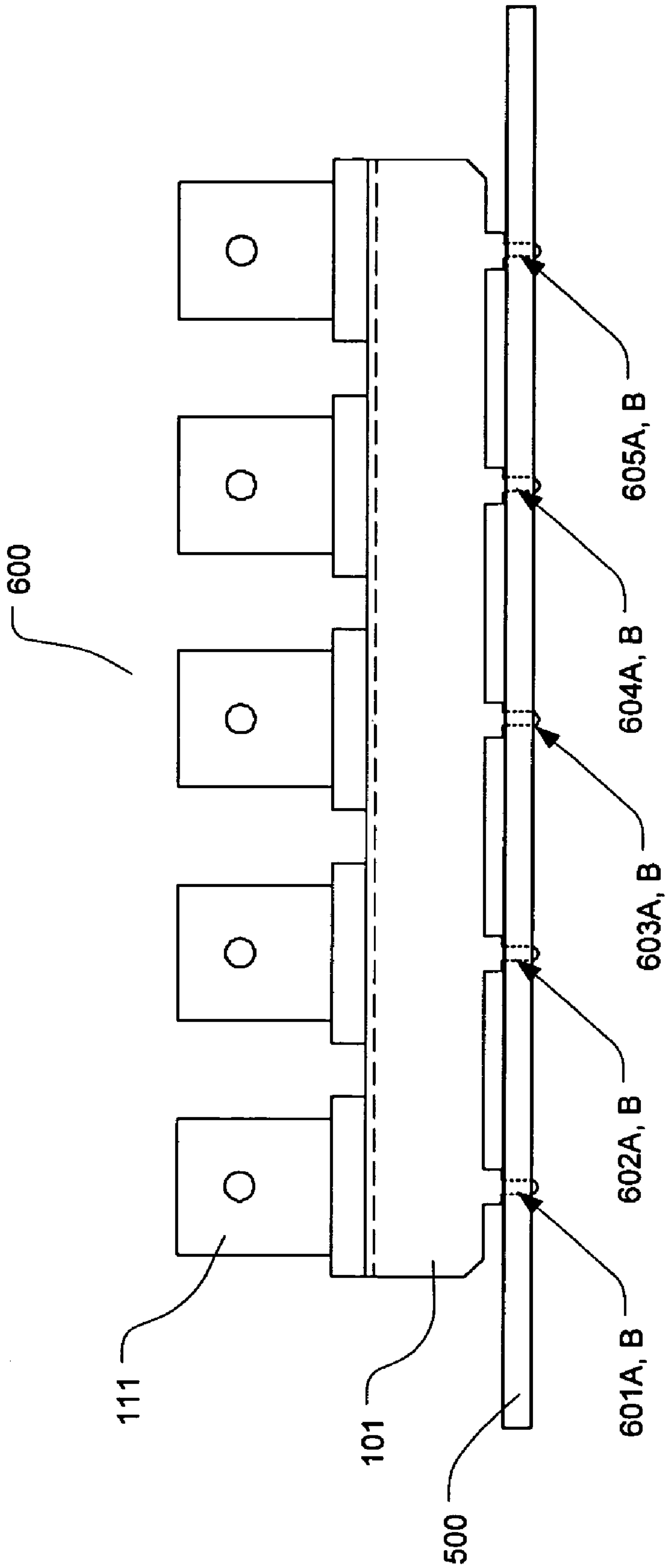
FIG. 6 is a partial assembly view of the connector assembly illustrated in FIG. 1, illustrating mounting of the assembly on a printed circuit board, in accordance with an embodiment of the present invention.

The multiple leg apertures and multiple center conductor apertures on PCB 500 provide the points by which connector assembly 100 is mounted. FIG. 6 is an illustration of connector assembly 100 mounted on PCB 500 to create assembled system 600. In this illustration, legs 121A and 121B of connector assembly 100 may be seated into leg apertures 501A and 501B, respectively, to form coupling points 601A and 601B. Legs 122A and 122B of connector assembly 100 may be seated into leg apertures 502A and 502B, respectively, to form coupling points 602A and 602B. Legs 123A and 123B of connector assembly 100 may be seated into leg apertures 503A and 503B, respectively, to form coupling points 603A and 603B. Legs 124A and 124B of connector assembly 100 may be seated into leg apertures 504A and 504B, respectively, to form coupling points 604A and 604B. Legs 125A and 125B of connector assembly 100 may be seated into leg apertures 505A and 505B, respectively, to form coupling points 605A and 605B.

In similar fashion, the center conductor of each input/output connector may be seated into a center conductor aperture on the PCB 500. For instance, the center conductor of input/output connector 111 may be seated into center conductor aperture 511; the center conductor of input/output connector 112 may be seated into center conductor aperture 512; the center conductor of input/output connector 113 may be seated into center conductor aperture 513; the center conductor of input/output connector 114 may be seated into center conductor aperture 514; and the center conductor of input/output connector 115 may be seated into center conductor aperture 515.

The connector assembly 100 is simply constructed and easy to install. The connector assembly 100 need only be connected to a PCB by soldering the legs and/or center conductors to the PCB. The connector assembly may be pre-fabricated before the PCB assembly process, such that a single placement process may mount the connector assembly (and hence multiple connectors) to the PC board. This process simplification reduces assembly time, as well as wear on the respective assembler (whether human or machine). The correct positioning may be achieved and confirmed by a single successful insertion of the connector assembly onto the aperture pattern of a PC board.

All of the apertures in the PC board may be formed (e.g., drilled) in conformance with a single aperture pattern, providing better connector reliability and quality control within each PC board and within each PC board lot.

As a further advantage in manufacturing, in one embodiment, the center conductors and the legs may be manufactured with similar cross-sectional distances, such that apertures of the same size and shape may be used for both legs and center conductors. The same tool(s) may be used to create both types of apertures, and the same process may be used to couple the legs and center conductors to the PC board. By using the same drill to create the conductor apertures and the leg apertures, and foregoing the use of rectangular apertures for the legs, the cost of manufacturing is reduced. Further, because the center conductor pin and the legs are of a small size, less solder is needed, reducing the level of heat exposure the PC board must undergo during the manufacturing process.

Thus, a connector assembly for one or more electronics connectors and a method of utilizing the connector assembly have been described. Particular embodiments described herein are illustrative only, and should not limit the present invention thereby. The invention is defined by the claims and their full scope of equivalents.

The invention claimed is:

1. A connector assembly comprising:

a conducting structure having a top section, a first flange at one side of said top section, a second flange at an opposite side of said top section, and a plurality of connector apertures in said top section, wherein said first flange and said second flange each comprise one or more legs, wherein each leg is physically configured to be seated into a first aperture pattern of a substrate; and a plurality of connectors coupled to said structure, wherein each connector of said plurality of connectors comprises a first conductor electrically coupled to said structure, and a second conductor electrically isolated from said structure and extending through a respective connector aperture and configured to be coupled into a second aperture pattern of said substrate.

2. The connector assembly of claim 1, wherein said structure provides a common ground plane to said plurality of connectors.

3. The connector assembly of claim 1, wherein said connectors comprise BNC connectors.

4. The connector assembly of claim 1, wherein said top section of said structure further comprises a top face and a bottom face, with said first flange and said second flange extending outwards from said bottom face.

5. The connector assembly of claim 4, wherein said plurality of connector apertures extends from said top face to said bottom face of said top section.

6. The connector assembly of claim 4, wherein said first flange and said second flange extend perpendicular to said top section from respective edges of said top section.

7. The connector assembly of claim 1, wherein each leg is configured with a step surface for abutting said substrate when said leg is seated in said first aperture pattern.

8. The connector assembly of claim 7, wherein said step surface is configured to prevent a lower edge of a respective flange from abutting said substrate.

9. The connector assembly of claim 1, wherein at least one of said plurality of connectors is an input jack.

10. The connector assembly of claim 1, wherein at least one of said plurality of connectors is an output jack.

11. The connector assembly of claim 1, wherein at least one of said plurality of connectors is a video jack.

12. The connector assembly of claim 1, wherein at least one of said plurality of connectors is an audio jack.

13. The connector assembly of claim 1, wherein said plurality of connectors are distributed linearly along said structure.

14. The connector assembly of claim 1, wherein said plurality of connectors are distributed in a two-dimensional array along said structure.

15. The connector assembly of claim 4, wherein said second conductors extend through a spatial cavity defined by said top section, said first flange and said second flange.

16. A connector assembly for electronic equipment comprising:

a substrate having a first aperture pattern and a second aperture pattern formed thereon;

a conducting structure comprising a plurality of flanges having a plurality of legs seated in said first aperture pattern, and a top section having a plurality of connector apertures; and a plurality of connectors coupled to said plurality of connector apertures in said top section of said conducting structure, each of said connectors comprising a first conductor isolated from said conducting structure and extending into said second aperture pattern and a second conductor coupled to said conducting structure.

17. The connector assembly of claim 16, wherein said subtrate is a printed circuit board.

18. The connector assembly of claim 16, wherein said legs and said first conductors are soldered to said substrate.

19. The connector assembly of claim 18, wherein said subtrate comprises one or more circuit traces electrically coupled to said first conductors.

20. The connector assembly of claim 18, wherein said substrate comprises one or more circuit traces electrically coupled to said legs.

21. The connector assembly of claim 16, wherein said plurality of connectors comprise BNC connectors.

22. The connector assembly of claim 16, wherein said structure provides a common ground plane for said plurality of connectors.

23. The connector assembly of claim 16, wherein said plurality of flanges extend from said top section, each of said flanges comprising one or more of said plurality of legs.

24. The connector assembly of claim 23, wherein said top section comprises a top face and a bottom face, wherein each of said plurality of apertures extends from said top face to said bottom face.

25. The connector assembly of claim 23, wherein one or more of said plurality of legs comprises a step surface abuting said substrate and defining a gap between a lower edge of a corresponding flange and said substrate.

26. The connector assembly of claim 25, further comprising one or more circuit traces on a surface of said substrate, wherein said traces pass through said gap.

27. A method for assembling an electronic device comprising:

providing a conducting structure having a top section and a plurality of flanges extending from said top section;

coupling a plurality of connectors to said top section of said structure to form a connector assembly. Wherein said structure is configured to act as a common ground for said plurality of connectors;

forming a pattern of apertures on a printed circuit board;

inserting said connector assembly into said pattern of apertures; and affixing said connector assembly to said printed circuit board.

28. The method of claim 27, wherein coupling said plurality of connectors to said structure comprises:

electrically coupling a first conductor of each connector to said structure; and extending a second conductor of each connector through said structure.

29. The method of claim 28, wherein said forming a pattern of apertures comprises:

forming a plurality of conductor apertures, wherein each of said conductor apertures is configured to receive a respective second conductor; and forming a plurality of leg apertures configured to receive a plurality of legs of said structure.

30. The method of claim 29, wherein inserting said connector assembly comprises simultaneously inserting said second conductors into said plurality of conductor apertures and inserting said plurality of legs into said plurality of leg apertures.

31. The method of claim 30, wherein affixing said connector assembly to said printed circuit board comprises:

placing solder within one or more of said plurality of leg apertures and one or more of said plurality of conductor apertures.

32. A connector assembly for assembly with a printed circuit board having a plurality of leg apertures and a plurality of conductor apertures, said connector assembly comprising:

a rigid conducting bracket comprising a top section and a plurality of flanges;

said top section comprising a plurality of connector apertures;

said plurality of flanges comprising a plurality of legs, said legs each having a first surface configured to abut said PC board;

a plurality of connectors seated in said plurality of connector apertures, each of said connectors comprising:

an outer conductor electrically coupled to said bracket, said outer conductor having a hollow bore, said outer conductor extending through said aperture a majority of a first distance from said top section to said first surface; and a signal conductor within said hollow bore, said signal conductor configured to be inserted into one of said conductor apertures when said plurality of legs are inserted into said plurality of leg apertures, said signal conductor extending beyond said first distance.

33. The connector assembly of claim 32, wherein a second distance between said end of said outer conductor and said first surface is equal to or less than 0.5 inches.

34. The connector assembly of claim 32, wherein said bracket comprises a common ground plane for said plurality of connectors.

35. The connector assembly of claim 34, wherein said plurality of legs are configured to couple to ground traces of said PC board.

36. The connector assembly of claim 32 wherein said first surface forms a step in each of said plurality of legs, which is configured to support a lower edge of at least one of said plurality of flanges away from said PC board.

37. The connector assembly of claim 32, wherein said plurality of connectors are distributed linearly in said bracket.

* * * * *

US007163405C1

(12) EX PARTE REEXAMINATION CERTIFICATE (9353rd)

United States Patent

Geil et al.

(10) Number: US 7,163,405 C1

(45) Certificate Issued: Oct. 8, 2012

(54) CONNECTOR ASSEMBLY APPARATUS FOR ELECTRONIC EQUIPMENT AND METHOD FOR USING SAME

(75) Inventors: Jacob Geil, Irvine, CA (US); William Keung, Brea, CA (US); Dan Clocan, Fullerton, CA (US)

(73) Assignee: RGB Systems, Inc., Anaheim, CA (US)

Reexamination Request:
No. 90/012,018, Nov. 21, 2011

Reexamination Certificate for:

| | |
|---|---|
| Patent No.: | **7,163,405** |
| Issued: | **Jan. 16, 2007** |
| Appl. No.: | **10/846,442** |
| Filed: | **May 14, 2004** |

(51) Int. Cl.

| | |
|---|---|
| ***H01R 12/00*** | (2006.01) |
| ***H01R 13/646*** | (2006.01) |
| ***H01R 13/74*** | (2006.01) |
| ***H05K 1/00*** | (2006.01) |

(52) U.S. Cl. .......................................................... 439/63

(58) Field of Classification Search ........................ None
See application file for complete search history.

(56) References Cited

To view the complete listing of prior art documents cited during the proceeding for Reexamination Control Number 90/012,018, please refer to the USPTO's public Patent Application Information Retrieval (PAIR) system under the Display References tab.

*Primary Examiner* — Yuzhen Ge

(57) ABSTRACT

A connector assembly and a method of utilizing a connector assembly to enhance performance, improve reliability and provide ease of assembly of electronic equipment are presented. The connector assembly comprises a rigid bracket capable of holding multiple connectors. The bracket acts as a common ground for all of the connectors. The connector assembly has multiple legs and connector conductors that insert into corresponding apertures on a PCB. The legs of the connector assembly are configured to permit the placement of circuit traces on the PCB in the spaces between the legs. After placement of the connector assembly onto the PCB, soldering or other techniques may be used to secure the connector assembly to the board and to connect the proper circuits to the connectors. Because the connectors are installed on the rigid bracket, repeated physical stresses induced on the ports or jacks do not affect the integrity of the PCB.

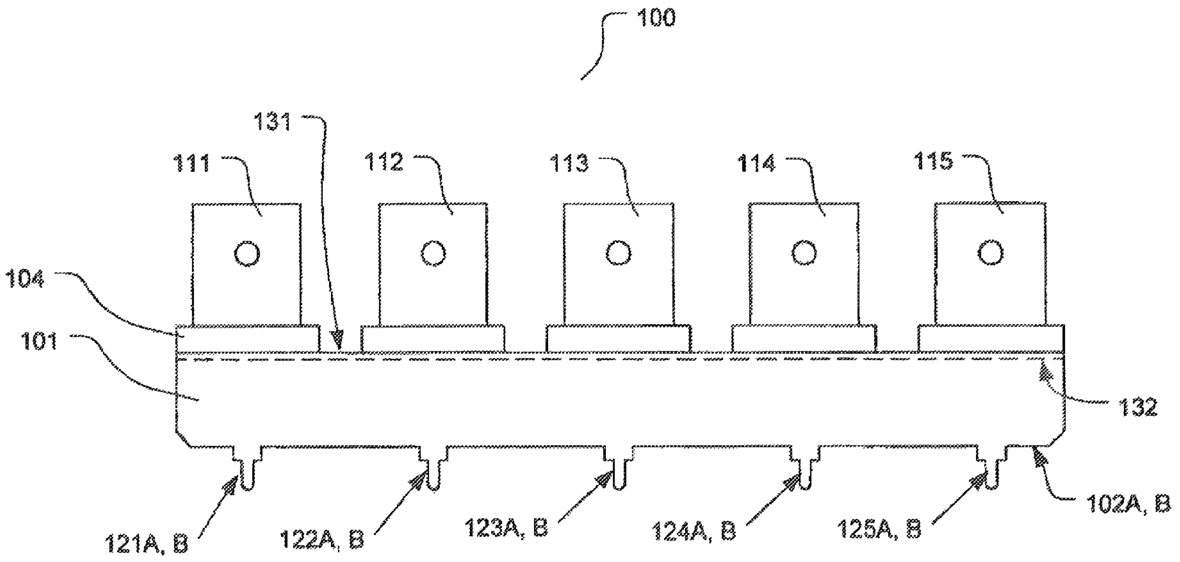

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 16, 17, 19, 25, 27 and 32 are determined to be patentable as amended.

Claims 2-15, 18, 20-24, 26, 28-31 and 33-37, dependent on an amended claim, are determined to be patentable.

1. A connector assembly comprising:

a conducting structure having a top section, a first flange at one side of said top section, a second flange at an opposite side of said top section, and a plurality of connector apertures in said top section, wherein said first flange and said second flange each comprise [one or more] *a plurality of* legs, wherein each leg is physically configured to be seated into a first aperture pattern of a substrate; and a plurality of connectors coupled to said structure, wherein each connector of said plurality of connectors comprises a first conductor electrically coupled to said structure, and a second conductor electrically isolated from said structure and extending through a respective connector aperture and configured to be coupled into a second aperture pattern of said substrate*;*

*wherein said second conductor of each of said plurality of connectors is aligned between opposite pairs of legs of said flanges.*

16. A connector assembly for electronic equipment comprising:

a substrate having a first aperture pattern and a second aperture pattern formed thereon;

a conducting structure comprising a plurality of flanges having a plurality of legs seated in said first aperture pattern, and a top section having a plurality of connector apertures; and a plurality of connectors coupled to said plurality of connector apertures in said top section of said conducting structure, each of said connectors comprising a first conductor isolated from said conducting structure and extending into said second aperture pattern and a second conductor coupled to said conducting structure*, wherein said second aperture pattern comprises apertures aligned between opposite pairs of apertures of said first aperture pattern.*

17. The connector assembly of claim 16, wherein said [subtrate] *substrate* is a printed circuit board.

19. The connector assembly of claim 18, wherein said [subtrate] *substrate* comprises one or more circuit traces electrically coupled to said first conductors.

25. The connector assembly of claim 23, wherein one or more of said plurality of legs comprises a step surface [abuting] *abutting* said substrate and defining a gap between a lower edge of a corresponding flange and said substrate.

27. A method for assembling an electronic device comprising:

providing a conducting structure having a top section and a plurality of flanges extending from said top section*, each of said flanges comprising a plurality of legs*;

coupling a plurality of connectors *each comprising a first conductor and a second conductor* to said top section of said structure to form a connector assembly[. Wherein]*; wherein* said structure is configured to act as a common ground for said *first conductors of said* plurality of connectors;

forming a pattern of apertures on a printed circuit board*, said pattern of apertures comprising a plurality of leg apertures for said plurality of legs of said flanges and a plurality of conductor apertures for said second conductors of said connectors, each of said conductor apertures being aligned between opposite pairs of said leg apertures*;

inserting said connector assembly into said pattern of apertures; and affixing said connector assembly to said printed circuit board.

32. A connector assembly for assembly with a printed circuit board having a plurality of leg apertures and a plurality of conductor apertures, said connector assembly comprising:

a rigid conducting bracket comprising a top section and a plurality of flanges;

said top section comprising a plurality of connector apertures;

said plurality of flanges comprising a plurality of legs, said legs each having a first surface configured to abut said PC board;

a plurality of connectors seated in said plurality of connector apertures, each of said connectors comprising:

an outer conductor electrically coupled to said bracket, said outer conductor having a hollow bore, said outer conductor extending through said aperture a majority of a first distance from said top section to said first surface; and a signal conductor within said hollow bore, said signal conductor configured to be inserted into one of said conductor apertures when said plurality of legs are inserted into said plurality of leg apertures, said signal conductor extending beyond said first distance*, said signal conductor being aligned between opposite pairs of said plurality of legs.*

* * * * *